United States Patent
Suwa

(10) Patent No.: US 10,068,037 B2
(45) Date of Patent: Sep. 4, 2018

(54) SIMULATION METHOD AND SIMULATION APPARATUS FOR CONTINUUM MOTION ANALYSIS USING A PARTICLE METHOD

(71) Applicant: FUJITSU LIMITED, Kawasaki-shi, Kanagawa (JP)

(72) Inventor: Tamon Suwa, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 413 days.

(21) Appl. No.: 14/950,373

(22) Filed: Nov. 24, 2015

(65) Prior Publication Data

US 2016/0196373 A1   Jul. 7, 2016

(30) Foreign Application Priority Data

Jan. 6, 2015 (JP) .................................. 2015-000797

(51) Int. Cl.
*G06F 17/10* (2006.01)
*G06F 17/50* (2006.01)

(52) U.S. Cl.
CPC .............................. *G06F 17/5009* (2013.01)

(58) Field of Classification Search
CPC .................................................. G06F 17/5018
USPC ........................................................... 703/2
See application file for complete search history.

(56) References Cited

U.S. PATENT DOCUMENTS

| 8,903,693 B2 * | 12/2014 | McDaniel | G06F 17/5018 345/420 |
| 2010/0094608 A1 * | 4/2010 | Oh | G06F 17/5009 703/9 |
| 2013/0166615 A1 | 6/2013 | Suwa | |
| 2014/0114588 A1 | 4/2014 | Suwa | |
| 2014/0226158 A1 * | 8/2014 | Trainer | G02B 6/32 356/336 |
| 2015/0161810 A1 * | 6/2015 | Macklin | G06T 13/60 345/474 |

FOREIGN PATENT DOCUMENTS

| JP | 2008-111675 | 5/2008 |
| JP | 2010-243293 | 10/2010 |
| JP | 2014-81900 A | 5/2014 |
| WO | 2012/025995 | 3/2012 |

OTHER PUBLICATIONS

G.R. Liu et al., "Smoothed Particle Hydrodynamics : a meshfree particle method", World Scientific, 2003, pp. 138-141 (5 pages).
(Continued)

*Primary Examiner* — Andy Ho
(74) *Attorney, Agent, or Firm* — Fujitsu Patent Center

(57) ABSTRACT

A processing unit determines, based on positions of a plurality of particles representing a continuum and positions of a plurality of boundary elements representing a boundary between a first region and a second region, whether each of the plurality of particles is located in the second region. Then, the processing unit calculates, for a particle located in the second region, a force toward the first region, based on a distance between the boundary represented by the plurality of boundary elements and the particle. Then, the processing unit analyzes motion of the plurality of particles while applying the force to the particle located in the second region.

6 Claims, 15 Drawing Sheets

(56) References Cited

OTHER PUBLICATIONS

M. G. Gesteira et al. "User Guide for the SPHysics Code v1.4", Feb. 2009, pp. 1-73 (73 pages).
Takahiro Harada et al., "Real-time Fluid Simulation Coupled with Cloth", IPSJ SIG Technical Report, 2007-CG-129 (3), Nov. 12, 2007, pp. 13-18 (6 pages), English Abstract.
Japanese Office Action dated May 22, 2018 for corresponding Japanese Patent Application No. 2015-000797, with English Translation, 6 pages.

\* cited by examiner

SIMULATION METHOD AND SIMULATION APPARATUS FOR CONTINUUM MOTION ANALYSIS USING A PARTICLE METHOD

CROSS-REFERENCE TO RELATED APPLICATION

This application is based upon and claims the benefit of priority of the prior Japanese Patent Application No. 2015-000797, filed on Jan. 6, 2015, the entire contents of which are incorporated herein by reference.

FIELD

The embodiments discussed herein are related to a simulation method and a simulation apparatus.

BACKGROUND

A technique called a particle method is used in continuum motion analysis. The continuum motion analysis includes fluid analysis for examining the flow of fluid such as water and air by using numerical calculations, elastic body analysis for examining the behavior of a compressed elastic body such as rubber, and the like. A continuum is a set of mass points having macroscopic properties of the material, and the mass points are continuously and densely distributed in the space where the material exists. The particle method is a technique that represents a continuum by a distribution of particles and analyzes the motion of the continuum as the motion of particles. Known particle methods include a smoothed particle hydrodynamics (SPH) method and a moving particle semi-implicit (MPS) method. Further, there is a method called a distinct element method, which is a technique for representing the behavior of powder fluid based on the particle method.

When representing an object to be analyzed by a distribution of particles, a fixed boundary is set. There are various methods for representing a fixed boundary.

The following three methods are the typical methods for representing a fixed boundary based on the particle method. The first method disposes virtual fluid particles (hereinafter referred to as "boundary particles") along a boundary, considers the boundary particles as fluid adhering to a fixed boundary, and thereby represents the fixed boundary. The second method sets a repulsive force between two particles, one being a boundary particle disposed in the same manner as the first method and the other one representing a continuum to be analyzed. The repulsive force has a magnitude as a function of the distance between the two particles, and has a direction along a relative position vector of the two particles. Thus, the area of motion of the particle representing the continuum is restricted to the inside of a fixed boundary. The third method disposes virtual continuum particles at positions that are reflectively symmetrical to the positions of particles representing a continuum to be analyzed, across a predetermined boundary surface, and thereby represents a fixed boundary.

Another method for representing a fixed boundary is to dispose boundary particles, apply a repulsive force in the normal direction of the boundary surface to a continuum particle that has approached any of the boundary particles within a certain distance, and thereby represent a fixed boundary.

There is also a method that represents a fixed boundary as a set of polygons. This method applies, between a continuum particle and a polygon whose coordinates of the center of gravity are closest to the continuum particle, a repulsive force based on the distance between the continuum particle and a plane containing the polygon. The repulsive force is applied only when the distance between the continuum particle and the plane containing the polygon is equal to or less than a certain value.

Further, there has been proposed a high versatile fluid analysis apparatus capable of uniformly handling a wettability model, and capable of accurately performing an analysis even with a low spatial resolution. The fluid analysis apparatus records the velocity, the position, and the pressure, for each of first particles representing fluid and for each of second particles representing a wall in contact with the fluid. Further, the fluid analysis apparatus specifies a contact angle $\theta$ between the fluid and the wall, and specifies a particle located within the range of application of an acting force to each particle from another particle. The fluid analysis apparatus calculates the acting force applied from the first particle using a first function, and calculates the acting force applied from the second particle using the first function multiplied by $(1+\cos \theta)/2$.

Further, there has been proposed a continuum motion analysis program that causes a computer to execute the following process. According to the continuum motion analysis program, the computer represents a continuum as particles, represents a fixed boundary as a set of micro regions (micro-surface elements) having an arbitrary shape, and calculates a repulsive force applied from each micro-surface element located within the influence range of each continuum particle to the continuum particle in the normal direction of the micro-surface element. Then, the computer calculates a force applied from the fixed boundary to the continuum particle by adding up the repulsive forces.

There has also been proposed a flow analysis method that is capable of handling an arbitrary shape with regard to the boundary condition on a fixed wall while reducing the calculation cost, and that has high calculation accuracy. According to the flow analysis method, for each of first particles determined to be within a predetermined distance from a wall boundary, the curvature of the wall boundary at the position closest to that first particle is calculated. Then, a plurality of second particles representing a wall are arranged as a boundary condition so as to be symmetrical to the first particles across the wall boundary while being enlarged with enlargement factors corresponding to the calculated curvatures.

See, for example, the following references:
Japanese Laid-open Patent Publication No. 2008-111675;
International Publication Pamphlet No. WO2012/025995;
Japanese Laid-open Patent Publication No. 2010-243293;
G. R. Liu, and M. B. Liu, "Smoothed Particle Hydrodynamics: A Meshfree Particle Method", World Scientific Pub Co Inc., October 2003, pp. 138-141;
M. G. Gesteira, B. D. Rogers, R. A. Dalrymplem, A. J. C. Crespo, and M. Narayanaswamy, "User Guide for the SPHysics Code v1.4", February 2009, pp. 16-19; and
Takahiro HARADA, Seiichi KOSHIZUKA, and Yoichiro KAWAGUCHI, "Real-time Fluid Simulation Coupled with Cloth" Proceedings of Information Processing Society of Japan, Proceedings of Graphics and CAD Research Society, Nov. 12, 2007, pp. 13-18.

Of these conventional techniques, the fixed-boundary representation method that represents the boundary surface as a set of micro-surface elements is capable of reducing the memory usage for analysis and the calculation time for analysis, and has fewer restrictions on the applicable situations, compared to other representation methods. However, this method applies a repulsive force to a continuum particle that has approached within a certain distance from any of the micro-surface elements, and therefore it is not possible to analyze the motion of a continuum in a region having a gap narrower than the certain distance. The distance from a boundary element in which repulsive force is applied is often set to be comparable to the average particle interval in accordance with the spatial resolution in numerical calculations, for example. Thus, when the particle interval is about 1 cm, it is not possible to handle the process of particles entering a gap with a width of about 5 mm.

SUMMARY

According to one aspect of the invention, there is provided a non-transitory computer-readable storage medium storing a computer program that causes a computer to perform a procedure including: determining, based on positions of a plurality of particles representing a continuum and positions of a plurality of elements representing a boundary between a first region and a second region, whether each of the plurality of particles is located in the second region; calculating, for a particle located in the second region, a force toward the first region, based on a distance between the boundary represented by the plurality of elements and the particle; and analyzing motion of the plurality of particles while applying the force to the particle located in the second region.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
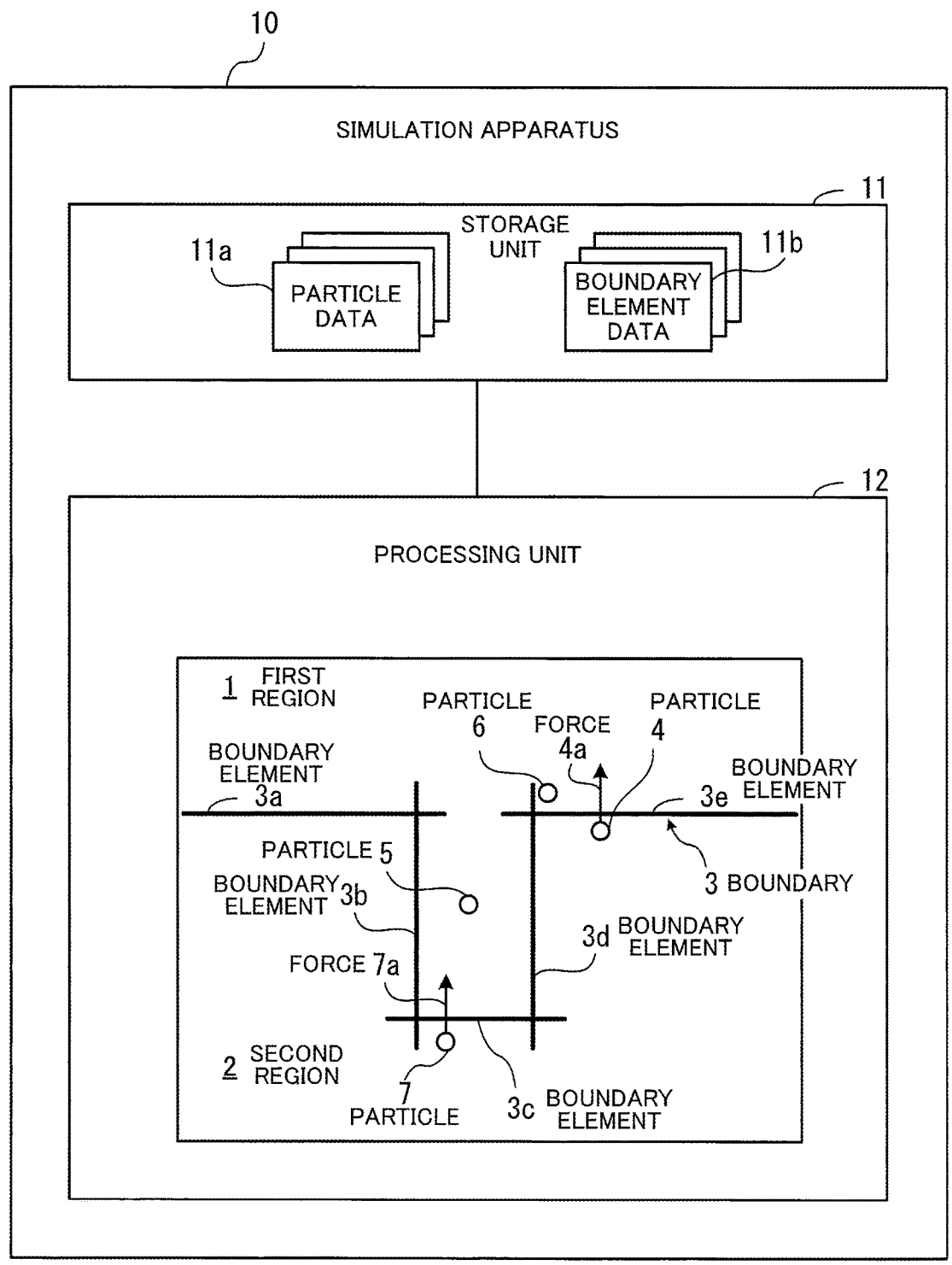
FIG. 1 illustrates an exemplary configuration of a simulation apparatus according to a first embodiment.

Several embodiments will be described below with reference to the accompanying drawings, wherein like reference numerals refer to like elements throughout. Note that features of certain embodiments may be combined with features of other embodiments as long as no inconsistency arises.

(a) First Embodiment

A first embodiment is a simulation apparatus that analyzes a continuum such as fluid, an elastic body, and the like, using a particle method. When analyzing particles representing a continuum, the simulation apparatus allows particles to move to the back side of a boundary, and does not cause particles to repel even when the particles approach the front side of the boundary. Instead, the simulation apparatus applies to particles having moved to the back side of the boundary a repulsive force for returning the particles to the front side. This allows particles to enter a narrow gap in a bending boundary.

FIG. 1 illustrates an exemplary configuration of a simulation apparatus 10 according to the first embodiment. The simulation apparatus 10 includes a storage unit 11 and a processing unit 12.

The storage unit 11 stores particle data 11a on a plurality of particles 4 through 7 representing a continuum, and boundary element data 11b on a plurality of boundary elements 3a through 3e representing a boundary 3 between a first region 1 and a second region 2. The first region 1 is a region where the material represented by a continuum exists.

The boundary 3 between the first region 1 and the second region 2 is formed by, for example, combining the plurality of boundary elements 3a through 3e such that the boundary elements 3a through 3e intersect one another. The boundary 3 bends at the intersections between the elements, and often has narrow gaps. For example, in FIG. 1, there is a narrow gap between the boundary element 3b and the boundary element 3d.

The particle data 11a includes information indicating, for example, the positions of the particles 4 through 7. The boundary element data 11b includes information indicating, for example, the positions of the boundary elements 3a through 3e. The plurality of boundary elements 3a through 3e are planar elements having disk shapes, for example. In the case where the plurality of boundary elements 3a through 3e have disk shapes, the boundary element data 11b further includes information indicating the size (for example, the radius or the area) and information indicating the direction (for example, the normal vector) of each of the boundary elements 3a through 3e.

The processing unit 12 determines whether each of the plurality of particles 4 through 7 is located in the second region 2, based on the positions of the plurality of particles 4 through 7 and the positions of the plurality of boundary elements 3a through 3e. For example, when the boundary elements 3a through 3e have disk shapes, the surface facing the first region 1 is defined as a front surface, and the surface facing the second region 2 is defined as a back surface. Then, the processing unit 12 selects each of the plurality of particles 4 through 7 as a particle of interest. Subsequently, the processing unit 12 determines whether there are one or more boundary elements with the particle of interest located at the back surface side thereof. If there is not such a boundary element, the processing unit 12 determines that the particle of interest is located in the first region 1. On the other hand, if there are such boundary elements, the processing unit 12 specifies a closest element that is the closest to the particle of interest among those boundary elements. Then, if the particle of interest is not located at the front surface side of an intersecting boundary element that intersects the closest element so as to project toward the first region 1, the processing unit 12 determines that the particle of interest is located at the second region 2.

Having detected the particles 4 and 7 located in the second region 2, the processing unit 12 calculates forces 4a and 7a toward the first region 1, for the particles 4 and 7. The force 4a is calculated based on a distance between the boundary 3, which is represented by the plurality of boundary elements 3a through 3e, and the particle 4. The force 7a is calculated based on a distance between the boundary 3 and the particle 7. For example, in the case where the plurality of boundary elements 3a through 3e are disks each having a front surface facing the first region 1 and a back surface facing the second region 2, the processing unit 12 calculates, for each of the particles 4 and 7, a force in the normal direction at the front surface side of the boundary element that is the closest to that particle among the boundary elements with that particle located at the back surface side thereof.

Further, in the case where the particle is located at the back surface side of each of a first element and a second element that intersect so as to be recessed away from the first region 1, the processing unit 12 calculates a force based on a distance between the particle and one of the first and second elements that is farther from the particle.

After calculating the forces, the processing unit 12 applies the calculated forces 4a and 7a to the particles 4 and 7 located in the second region 2, and analyzes the motion of the plurality of particles 4 through 7.

In the manner described above, when a particle moves to the back side of a boundary element, a repulsive force is applied to the particle. Therefore, even when there is a narrow gap in the shape of the boundary, particles are able to enter the gap easily. For example, the particle 5 is able to enter a gap easily without receiving a repulsive force, since the particle 5 is not located at the back side of any element. Accordingly, it is possible to analyze the influx of particles of fluid or an elastic body.

Further, when each of the plurality of particles through 7 moves to the second region 2 side, the particle receives a repulsive force from, for example, one of the plurality of boundary elements 3a through 3e of the boundary 3 with their back surfaces facing the particle. For example, the particle 4 is located at the back surface side of the boundary element 3d and the boundary element 3e. The boundary element 3e is the closest to the particle 4, and therefore the particle 4 receives, from the boundary element 3e, the force 4a in the normal direction of the boundary element 3e, for example. In this manner, the force 4a is received from the closest boundary element 3e, and thus the particle 4 is able to return to the first region 1 quickly.

Note that when the shape of the boundary 3 is defined using the plurality of boundary elements 3a through 3e, the ends of the elements may protrude beyond the shape to be represented. In the first embodiment, by adjusting the way of applying a repulsive force based on the angle between the elements, it is possible to prevent an unnatural repulsive force from being generated at the ends of the elements. For example, the position of the particle 6 is at the back side of the boundary element 3d, but is at the front side of the boundary element 3e that intersects the boundary element 3d so as to project toward the first region 1. In this case, no repulsive force is applied to the particle 6. That is, even when the ends of the intersecting elements protrude, an unnatural force is prevented from being applied to the particle 6 due to the influence of the protruding portions. Note that the position of the particle 7 is at the back side of the boundary element 3c and at the front side of the boundary element 3b that intersects the boundary element 3c, but the boundary element 3c and the boundary element 3d intersect so as to be recessed away from the first region 1. Therefore, the particle 7 receives, from the boundary element 3c, the force 7a in the normal direction of the boundary element 3c, for example.

Further, the ends of elements are allowed to protrude beyond the intersections between elements. Therefore, there is no need to handle information on connections between elements when representing the shape of the boundary 3 using the plurality of boundary elements 3a through 3e. This reduces cumbersome processing when generating the shape, and makes it easy to create the boundary 3 that completely covers the surface.

The method of setting a boundary surface in a continuum motion analysis by the simulation apparatus 10 of the first embodiment of FIG. 1 is superior to other methods in various aspects.

For example, in the case of a method that disposes boundary particles and applies a repulsive force in the normal direction of the boundary surface to a continuum particle that has approached any of the boundary particles within a certain distance, a large number of particles are used so as to represent a smooth boundary. When a large number of particles are used, large memory space and a large amount of calculation time are consumed. On the other hand, in the first embodiment, it is possible to set a boundary using a smaller number of elements than the number of particles that are used for setting the boundary. Therefore, it is possible to reduce the memory usage and the calculation time.

Further, among methods that set a boundary using a large number of particles, there is a method in which the direction of a repulsive force to be applied to a particle from the boundary is set to the direction of the normal vector that is obtained by using four boundary particles which are located at positions shifted by 1 in the positive direction and the negative direction on the x-axis and in the positive direction and the negative direction on the y-axis, respectively, from the position of a particle representing a continuum, for example. In this case, there is a constrain that the particles distributed on the boundary surface need to be arranged at regular grid points (so as to have a constant number of neighboring particles) or at positions obtained by continuously deforming the regular grid points. Accordingly, for example, in the case of arranging boundary particles at the positions of the gravity centers of a tetrahedral mesh, this method is not applicable. On the other hand, in the first embodiment, there is not such a constraint on the setting of a boundary, which allows high flexibility.

Further, there is a method that represents a fixed boundary as a set of polygons. However, according to this method, the polygons need to have a constant size. Therefore, if the polygons have different sizes, an unreasonable repulsive force might be generated near the boundary of the polygon. On the other hand, in the simulation apparatus 10 of the first embodiment, even when the elements forming the boundary do not have a constant size, it is possible to generate an appropriate repulsive force.

Further, there is a method that disposes virtual continuum particles at positions that are reflectively symmetrical across a boundary surface. According to this method, the boundary surface needs to be analytically represented in order to calculate the reflectively symmetrical positions. Therefore, this method is not applicable to, for example, the shape of a boundary surface that is created manually, or the shape of a boundary that is not given a formula representing the normal direction thereof. On the other hand, in the first embodiment, the normal direction of the boundary surface is uniquely determined from the disk element data, and therefore there is no need to use a formula to calculate the normal direction.

In the case of a method that arranges a plurality of second particles representing a wall so as to be symmetrical to first particles across a wall boundary while being enlarged with enlargement factors corresponding to the curvatures of the wall boundary at the positions closest to the first particles, when the boundary surface moves, calculation of a distance function needs to be performed in each step, and therefore the amount of calculation is excessively increased. Accordingly, the time needed for numerical calculations is increased. On the other hand, in the first embodiment, when the boundary surface moves, it is only needed to update the boundary data, and the time needed for numerical calculations only slightly increased.

In the case of a conventional method that represents a fixed boundary as a set of micro regions (micro-surface elements) having an arbitrary shape, a repulsive force is applied to a particle that has approached within a certain distance from any of boundary elements. Therefore, it is not possible to handle a gap narrower than that distance. The repulsive force from a boundary element is often set to be comparable to the average particle interval in accordance with the spatial resolution in numerical calculations. Thus, for example, when the particle interval is about 1 cm, it is not possible to handle the process of particles entering a gap with a width of about 5 mm. On the other hand, in the first embodiment, it is possible to cause particles to enter even a narrow gap, and therefore is possible to appropriately analyze the motion of a continuum in a region having a narrow gap.

The processing unit 12 may be realized by, for example, a processor of the simulation apparatus 10. The storage unit 11 may be realized by, for example, the memory of the simulation apparatus 10.

(b) Second Embodiment

Next, a second embodiment will be described. In the second embodiment, a motion analysis simulation of fluid or an elastic body is performed by numerical calculations using a particle method. Note that in the second embodiment, a boundary surface is set with circular disk elements.

Figure 2:
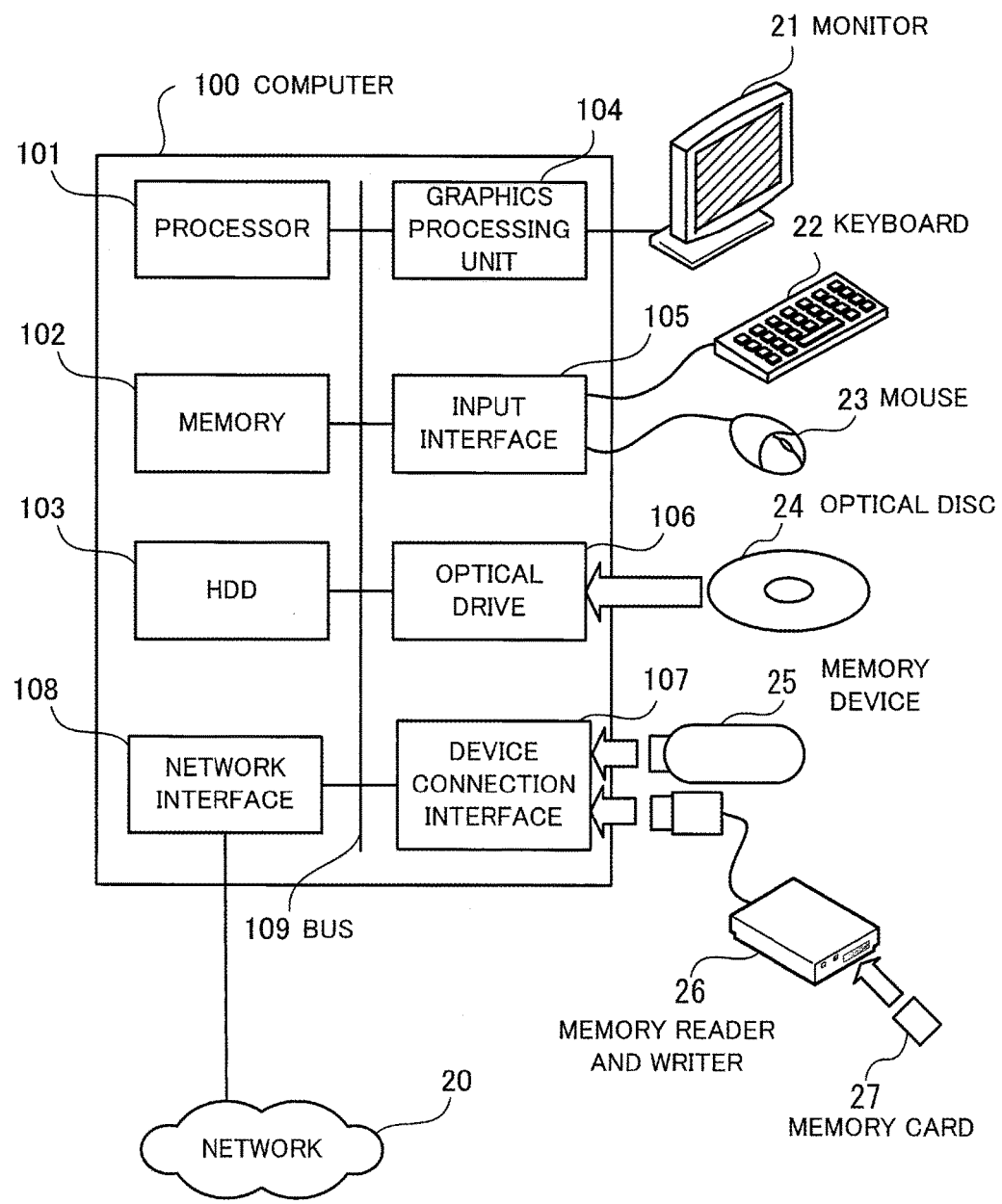
FIG. 2 illustrates an exemplary hardware configuration of a computer used in a second embodiment.

FIG. 2 illustrates an exemplary hardware configuration of a computer 100 used in the second embodiment. The entire operation of the computer 100 is controlled by a processor 101. A memory 102 and a plurality of peripheral devices are connected to the processor 101 via a bus 109. The processor 101 may be a multiprocessor. Examples of the processor 101 include a central processing unit (CPU), a micro processing unit (MPU), and a digital signal processor (DSP). At least a part of functions implemented by a program executed by the processor 101 may be implemented by using electronic circuits such as an application-specific integrated circuit (ASIC), a programmable logic device (PLD), and the like.

The memory 102 is used as a primary storage device of the computer 100. The memory 102 temporarily stores at least part of the operating system (OS) program and application programs that are executed by the processor 101. The memory 102 also stores various types of data needed for the processing performed by the processor 101. Examples of the memory 102 include a volatile semiconductor storage device such as a random access memory (RAM) and the like.

The peripheral devices connected to the bus 109 include a hard disk drive (HDD) 103, a graphics processing unit 104, an input interface 105, an optical drive 106, a device connection interface 107, and a network interface 108.

The HDD 103 magnetically writes data to and reads data from its internal disk. The HDD 103 is used as a secondary storage device of the computer 100. The HDD 103 stores the OS program, application programs, and various types of data. Note that a non-volatile semiconductor storage device such as a flash memory and the like may be used as a secondary storage device.

A monitor 21 is connected to the graphics processing unit 104. The graphics processing unit 104 displays an image on the screen of the monitor 21 in accordance with an instruction from the processor 101. Examples of the monitor 21 include a display device using a cathode ray tube (CRT), a liquid crystal display device, and the like.

A keyboard 22 and a mouse 23 are connected to the input interface 105. The input interface 105 receives signals from the keyboard 22 and the mouse 23, and transmits the received signals to the processor 101. The mouse 23 is an example of a pointing device, and other types of pointing devices may also be used. Examples of other types of pointing devices include a touch panel, a tablet, a touch pad, a track ball, and the like.

The optical drive 106 reads data from an optical disc 24 by using laser beams or the like. The optical disc 24 is a portable storage medium and stores data such that the data may be read through optical reflection. Examples of the optical disc 24 include digital versatile disc (DVD), DVD-RAM, compact disc read only memory (CD-ROM), CD-Recordable (CD-R), CD-Rewritable (CD-RW), and the like.

The device connection interface 107 is a communication interface that connects peripheral devices to the computer 100. For example, a memory device 25 and a memory reader and writer 26 may be connected to the device connection interface 107. The memory device 25 is a storage medium having a function to communicate with the device connection interface 107. The memory reader and writer 26 is a device that writes data to and reads data from a memory card 27. The memory card 27 is a card-type storage medium.

The network interface 108 is connected to a network 20. The network interface 108 exchanges data with other computers or communication apparatuses via the network 20.

With the hardware configuration described above, it is possible to realize the processing functions of the second embodiment. Note that the simulation apparatus 10 of the first embodiment may be realized with a hardware configuration similar to that of the computer 100 of FIG. 2. Of the components of the simulation apparatus 10, the processing unit 12 may be realized by the processor 101 of the computer 100. Of the components of the simulation apparatus 10, the storage unit 11 may be realized by the memory 102 or the HDD 103 of the computer 100.

The computer 100 realizes the processing functions of the second embodiment by executing a program stored in a computer-readable storage medium, for example. The program describing the procedure to be performed by the computer 100 may be stored in various storage media. For example, the program to be executed by the computer 100 may be stored in the HDD 103. The processor 101 loads at least part of the program from the HDD 103 into the memory 102 so as to execute the program. The program to be executed by the computer 100 may also be stored in a portable storage medium, such as the optical disc 24, the memory device 25, the memory card 27, and the like. The program stored in the portable storage medium may be executed after being installed into the HDD 103 under the control of, for example, the processor 101. Further, the processor 101 may execute the program by reading the program directly from the portable storage medium.

Figure 3:
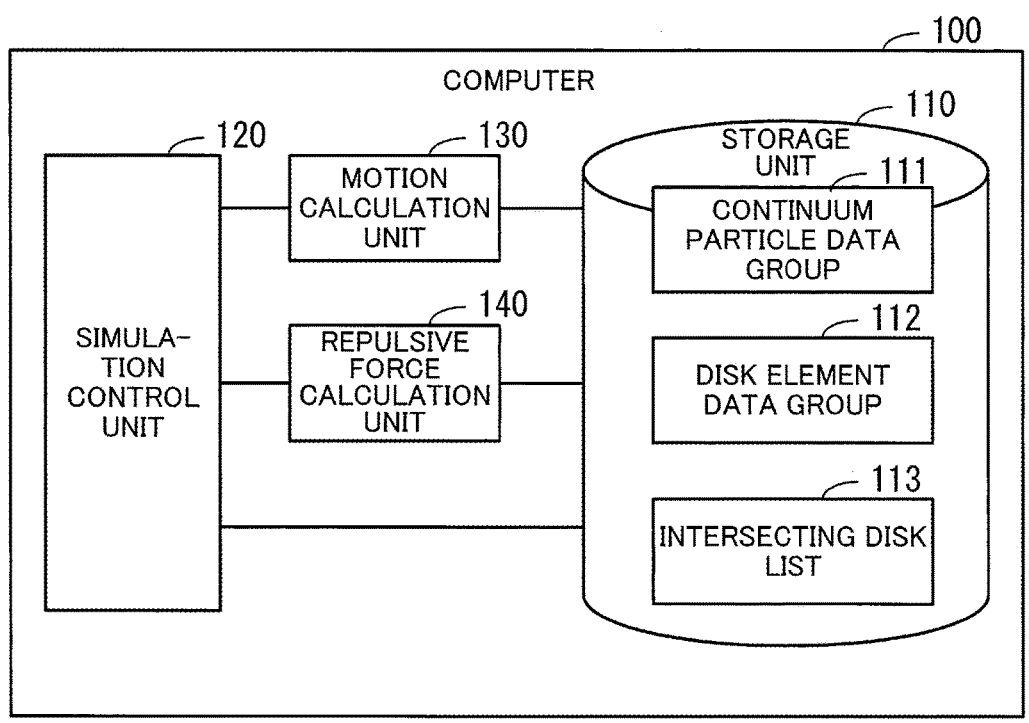
FIG. 3 is a functional block diagram of a simulation function of the computer.

FIG. 3 is a functional block diagram of a simulation function of the computer 100. The computer 100 includes a storage unit 110, a simulation control unit 120, a motion calculation unit 130, and a repulsive force calculation unit 140.

The storage unit 110 stores data used for simulation. For example, the storage unit 110 stores a continuum particle data group 111, a disk element data group 112, and an intersecting disk list 113. A part of the storage area of the memory 102 or the HDD 103 serves as the storage unit 110, for example.

The continuum particle data group 111 is a set of pieces of unit data (pieces of continuum particle data) prepared for the respective continuum particles. The continuum particle data is data on a model of fluid or an elastic body, and indicates the state of each of particles representing a continuum such as fluid, an elastic body, and the like. The initial values of the continuum particle data group 111 are set by the simulation control unit 120 when starting a simulation, and are updated as the simulation progresses.

The disk element data group 112 is a set of pieces of unit data (pieces of disk element data) prepared for the respective disk elements, and is data on a model representing the entire wall of a boundary, such as a wall of a container storing fluid and the like, as a collection of small disks. The disk element data indicates the shape of each of disk elements forming a boundary surface. The disk element data group 112 is set by the simulation control unit 120 when starting a simulation.

The intersecting disk list 113 is a list of disk elements intersecting a certain disk element. The intersecting disk list 113 is intermediate data created when the repulsive force calculation unit 140 calculates a repulsive force.

The simulation control unit 120 performs a simulation of the motion analysis of a continuum, in cooperation with the motion calculation unit 130 and the repulsive force calculation unit 140. For example, the simulation control unit 120 calculates the state of each continuum particle in each time step of the simulation. Then, the simulation control unit 120 causes the motion calculation unit 130 to calculate the motion (such as velocity and acceleration) of each continuum particle. Further, the simulation control unit 120 causes the repulsive force calculation unit 140 to calculate a repulsive force applied to each continuum particle from a disk element.

The motion calculation unit 130 calculates the position and physical quantity of each continuum particle in each time step of the simulation, in accordance with the physical law applied to fluid or an elastic body. The motion calculation unit 130 updates each piece of continuous particle data of the continuum particle data group 111, based on the calculation result.

The repulsive force calculation unit 140 calculates, for a continuum particle that has approached a disk element within a certain distance, a repulsive force to be applied in the normal direction of the disk element, in order to apply a fixed boundary condition to the motion of the continuum particle. For example, when a continuum particle is located at the back side of a disk element, the repulsive force calculation unit 140 applies to the continuum particle a repulsive force toward the front side of the disk element.

Note that the functions of each component illustrated in FIG. 3 may be realized by, for example, causing the computer 100 to execute a program module corresponding to that component.

Next, data in the storage unit 110 will be described in detail.

Figure 4:
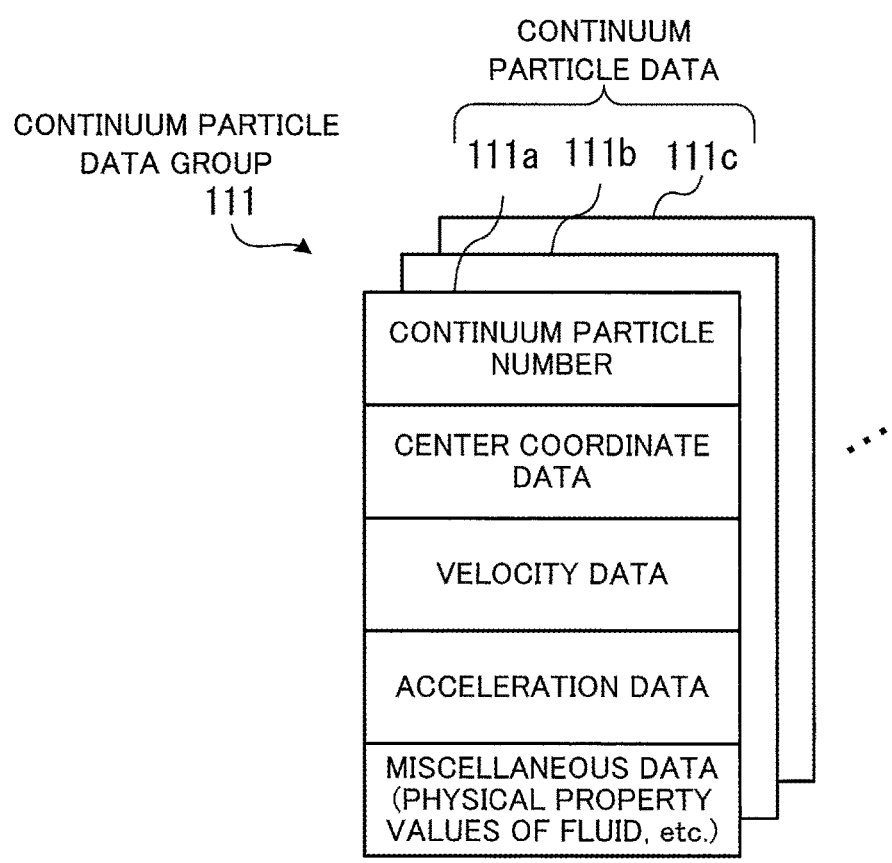
FIG. 4 illustrates an example of continuum particle data.

FIG. 4 illustrates an example of continuum particle data. Each of pieces of continuum particle data 111a, 111b, 111c, and so on included in the continuum particle data group 111 includes, for example, the continuum particle number, center coordinate data, velocity data, acceleration data, and miscellaneous data. The continuum particle number is the identification number of the continuum particle. The center coordinate data indicates the coordinates of the position of the center (for example, the center of gravity) of the continuum particle. The velocity data indicates the moving velocity of the continuum particle. The acceleration data indicates the acceleration of the continuum particle. The miscellaneous data includes, for example, the physical property values of fluid represented by continuum particle, and the like. More specifically, the miscellaneous data includes, for example, data such as influence radius, density, mass, deformation gradient tensor, material properties, temperature, and the like.

Figure 5:
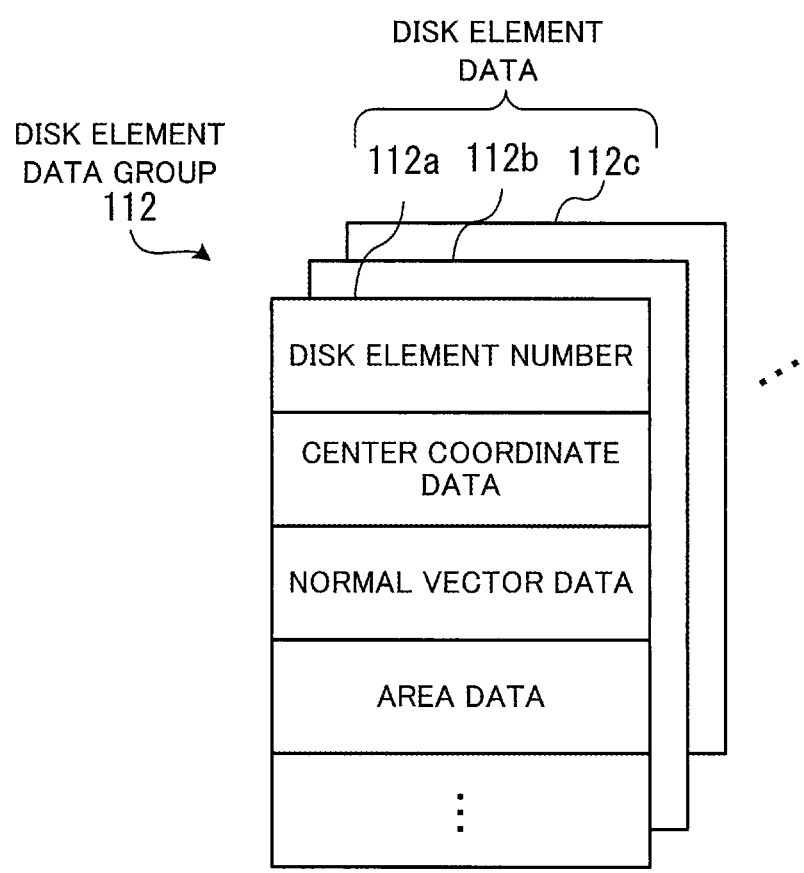
FIG. 5 illustrates an example of disk element data.

FIG. 5 illustrates an example of disk element data. Each of pieces of disk element data 112a, 112b, 112c, and so on included in the disk element data group 112 includes, for example, the disk element number, center coordinate data, normal vector data, area data, and the like. The disk element number is the identification number of the disk element. The center coordinate data indicates the coordinates of the position of the center (for example, the center of gravity) of the disk element. The normal vector data is vector data indicating a normal vector directed toward the front side of the disk element with a magnitude of 1. The area data is data indicating the area of the disk element. It is possible to calculate the radius of the disk element based on the area data.

Figure 6:
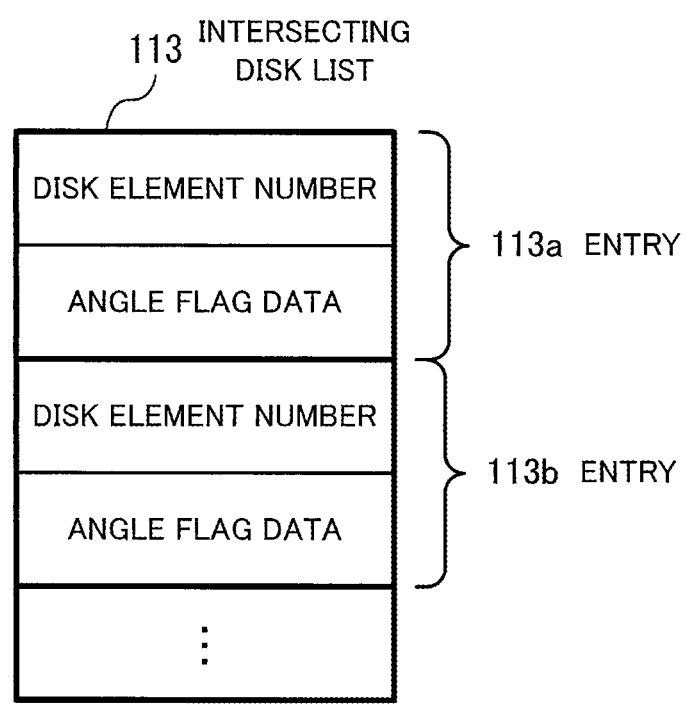
FIG. 6 illustrates an example of an intersecting disk list.

FIG. 6 illustrates an example of the intersecting disk list 113. In the intersecting disk list 113, entries 113a, 113b, and so on are registered that relate to respective disk elements intersecting a disk element subjected to a determination. Each entry includes the disk element number and angle flag data. The disk element number is the identification number of the disk element that intersects the disk element subjected to a determination. The angle flag data indicates whether the angle at the front side of the position of the crossing between the disk element identified by the corresponding disk element number and the disk element (the closest element) subjected to a determination forms a projection or a recess. If the angle at the front side of the crossing position is 180 degrees or greater, the disk elements intersect so as to form a projection. On the other hand, if the angle on the front side of the crossing position is less than 180 degrees, the disk elements intersect so as to form a recess.

The computer 100 having the functions described above performs a motion analysis simulation of a continuum. Note that in a simulation of the second embodiment, continuum particles are allowed to move to the back side of a fixed boundary. Further, the boundary surface of the fixed boundary is represented by disk elements, and a repulsive force is applied to a continuum particle that has moved to the back side of the disk elements. Accordingly, unlike the case where a repulsive force is generated at the front side of the fixed boundary, continuum particles are able to enter a very narrow space.

Figure 7:
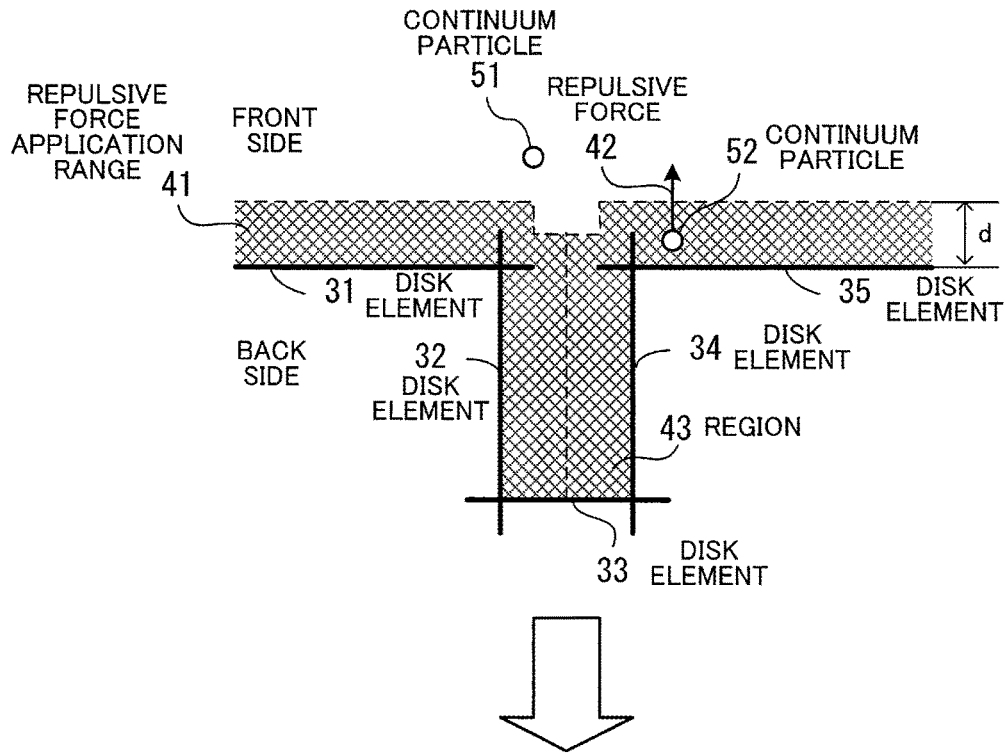
FIG. 7 illustrates the difference in the repulsive force application range on a fixed boundary.
Figure 7:
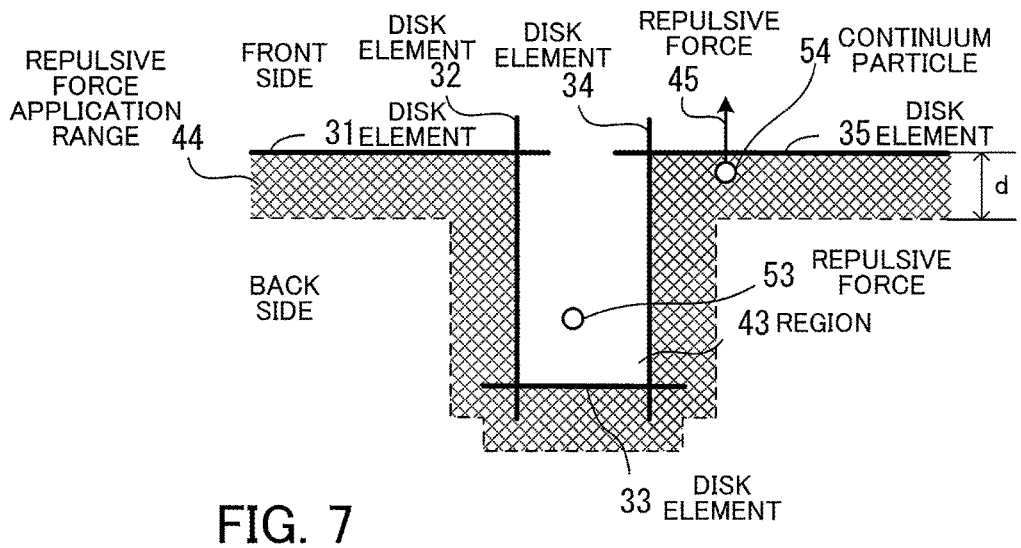

FIG. 7 illustrates the difference in the repulsive force application range on a fixed boundary. In FIG. 7, the upper diagram illustrates an example of the case where a repulsive force is applied to a continuum particle at the front side of a fixed boundary, and the lower diagram illustrates an example of the case where a repulsive force is applied to a continuum particle at the back side of a fixed boundary. The fixed boundary has a boundary surface represented by a plurality of disk elements 31 through 35. In the examples of FIG. 7, the upper side of the boundary surface represented by the disk elements 31 through 35 is the front side, and the lower side is the back side.

In the case of applying a repulsive force to a continuum particle at the front side of the fixed boundary, a range of equal to or less than a predetermined distance d from the disk elements 31 through 35 at the front side thereof is a repulsive force application range 41. Although no repulsive force is applied to a continuum particle 51 located outside the repulsive force application range 41, a repulsive force 42 in the direction away from the disk element 35 is applied to a continuum particle 52 located within the repulsive force application range 41.

When there is a region 43 with a width of less than the predetermined distance d specifying the repulsive force application range 41 (for example, equal to or less than twice the distance d), it is difficult for the continuum particles 51 and 52 to enter the region 43. In the examples of FIG. 7, the region surrounded by the disk elements 32 through 34 is the narrow region 43. Further, even if the continuum particles 51 and 52 enter the narrow region 43, the continuum particles 51 and 52 constantly receive a repulsive force from any of the disk elements. Therefore, it is not possible to analyze the motion accurately.

On the other hand, in the case of applying a repulsive force to a continuum particle at the back side of the fixed boundary, a range of equal to or less than the predetermined distance d from the disk elements 31 through 35 at the back side thereof is a repulsive force application range 44. Although no repulsive force is applied to the continuum particle 53 located outside the repulsive force application range 44, a repulsive force 45 in the direction toward the front side of the disk element 35 is applied to the continuum particle 54 located within the repulsive force application range 44.

In this case, the narrow region 43 is outside the repulsive force application range 44. Therefore, the continuum particles 53 and 54 are able to enter the region 43 easily. Further, since no repulsive force is applied to the continuum particle 53 that has entered the narrow region 43, it is possible to analyze the motion accurately.

Note that in a plurality of disk elements forming the fixed boundary, the adjacent disk elements intersect each other. Accordingly, each of the disk elements has portions protruding beyond the intersections with adjacent disk elements. The protruding ends of disk elements that are generated when combining the disk elements in a three dimensional space are processed differently depending on whether the disk elements intersect so to form a projection or so as to form a recess, in accordance with the following policy.

Figure 8:
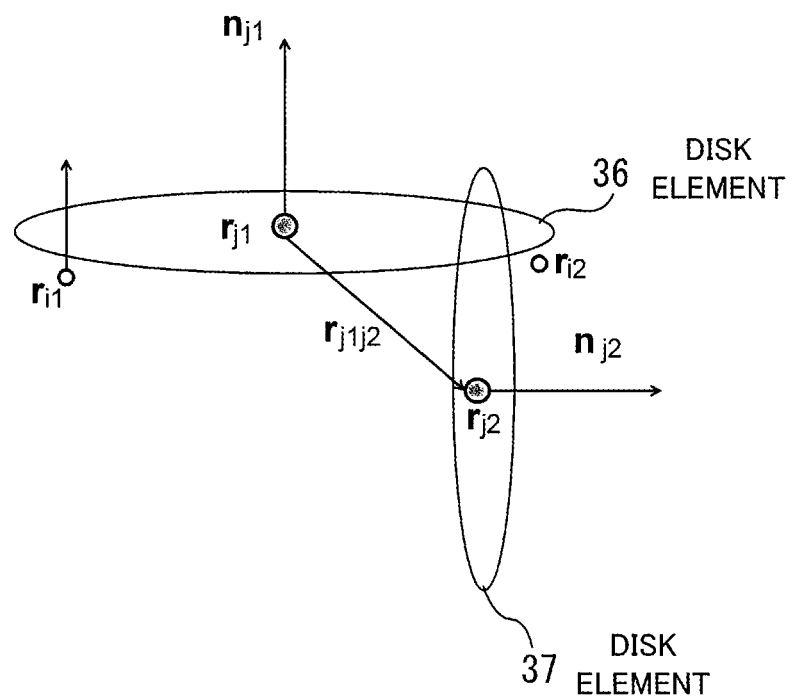
FIG. 8 illustrates an example of disk elements that intersect so as to form a projection.

FIG. 8 illustrates an example of disk elements that intersect so as to form a projection. In the example of FIG. 8, a disk element 36 and a disk element 37 intersect so as to form a projection. The center position of the disk element 36 is represented by a position vector $r_{j1}$. The normal vector of the disk element 36 is $n_{j1}$. Likewise, the center position of the disk element 37 is represented by a position vector $r_{j2}$. The normal vector of the disk element 37 is $n_{j2}$. A relative position vector $r_{j1j2}$ from the disk element 36 to the disk element 37 is obtained by subtracting the position vector $r_{j1}$ of the disk element 36 from the position vector $r_{j2}$ of the disk element 37.

As illustrated in FIG. 8, when the disk elements 36 and 37 intersect so as to form a projection, a continuum particle $r_{i1}$ that has moved to the back side of the disk elements 36 and 37 receives a repulsive force from the perpendicularly closest disk element 36. On the other hand, a continuum particle $r_{i2}$ located at the back side of the perpendicularly closest disk element 36 and at the front side of the disk element 37 that intersects the disk element 36 so as to form a projection does not receive a repulsive force from any of the disk elements 36 and 37.

In this manner, even in the case where a continuum particle is located at the back side of a disk element, if the continuum particle is located at the front side of another disk element adjacent thereto, no repulsive is applied to the continuum particle. Thus, no repulsive force is applied from any disk element to a continuum particle located inside the original fixed boundary (at the front surface side of disk elements). Accordingly, it is possible to accurately analyze the motion of fluid or an elastic body even at the portion beyond the crossing position of intersecting disk elements.

A determination as to whether the angle at which the two disk elements 36 and 37 intersect forms a projection or a recess is made based on the sign of the inner product of the relative position vector $r_{j1j2}$ between the two disk elements 36 and 37 and each of the normal vectors $n_{j1}$ and $n_{j2}$.

For example, the repulsive force calculation unit 140 acquires pieces of normal vector data indicating the normal vectors $n_{j1}$ and $n_{j2}$ from the respective pieces of disk element data of the disk elements 36 and 37. Further, the repulsive force calculation unit 140 acquires pieces of area data from the respective pieces of disk element data of the disk elements 36 and 37, and calculates radii $R_{j1}$ and $R_{j2}$ of the disk elements 36 and 37 from the respective pieces of area data. Further, the repulsive force calculation unit 140 calculates the relative position vector $r_{j1j2}$ by calculating the difference between the coordinate components of the respective pieces of center coordinate data of the disk element 36 and the disk element 37.

When both the following conditions are satisfied, a determination is made that the disk element 36 and the disk element 37 make an angle that forms a projection.

$$r_{j1j2} \cdot n_{j1} < 0 \qquad \text{Condition 1:}$$

$$-r_{j1j2} \cdot n_{j2} < 0 \qquad \text{Condition 2:}$$

When none of the conditions is satisfied, a determination is made that the disk element 36 and the disk element 37 make an angle that forms a recess. When the two intersecting disk elements satisfy only one of the conditions and does not satisfy the other one of the conditions, it is not possible to reasonably represent the front and back of the boundary by these two elements. In this case, the processing is stopped or processing according to the case of a recess or the case of a projection is performed.

Figure 9:
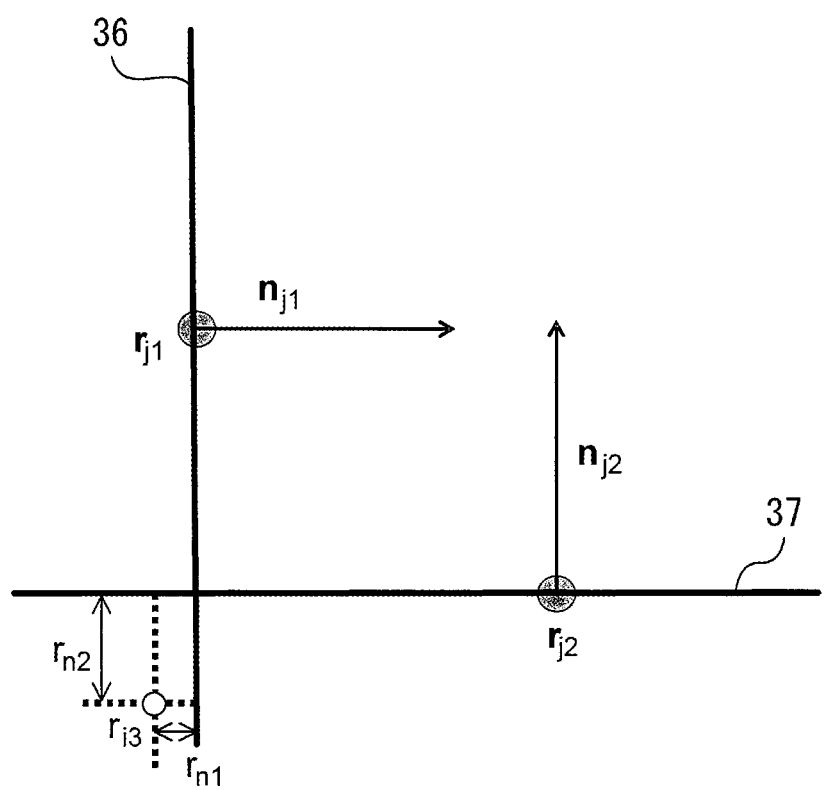
FIG. 9 illustrates an example of disk elements that intersect so as to form a recess.

FIG. 9 illustrates an example of disk elements that intersect so as to form a recess. In the example of FIG. 9, the disk element 36 and the disk element 37 intersect so as to form a recess. In this situation, a continuum particle $r_{i3}$ having moved to the back side of the disk elements 36 and 37 receives a repulsive force from the perpendicularly farther one. For example, $r_{n1}$ is the perpendicular distance from the continuum particle $r_{i3}$ to the disk element 36, and $r_{n2}$ is the perpendicular distance from the continuum particle $r_{i3}$ to the disk element 37. In the example of FIG. 9, $r_{n1} < r_{n2}$. Therefore, the continuum particle $r_{i3}$ receives, from the disk element 37, a repulsive force in the positive direction of the normal vector $n_{j2}$ of the disk element 37.

In this manner, in the case where a continuum particle is located at the back side of a plurality of disk elements, a repulsive force is applied from the perpendicularly farthest disk element. Thus, it is possible to quickly reduce the distance by which the continuum particle moves further beyond a fixed boundary.

Next, the procedure of simulation will be described in detail.

Figure 10:
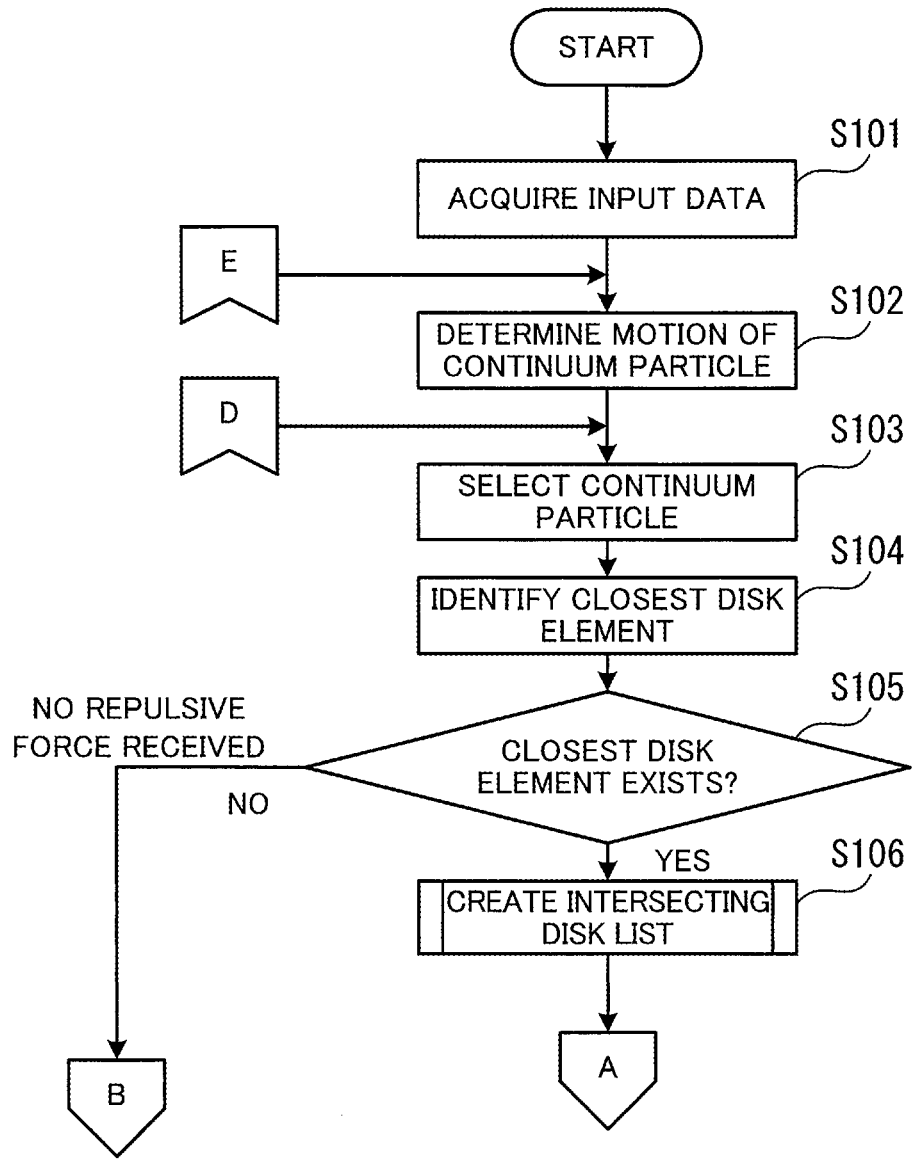
FIG. 10 is a first flowchart illustrating an exemplary procedure of simulation.

FIG. 10 is a first flowchart illustrating an exemplary procedure of simulation.

(Step S101) The simulation control unit 120 acquires input data. The input data includes continuum particle data that is the direct subject of numerical calculations, and disk element data that specifies the boundary conditions of the motion of continuum particles. The input data is input to the computer 100 by the user, for example. The simulation control unit 120 stores the input data in the storage unit 110 (see FIGS. 4 and 5).

Having acquired the input data, the simulation control unit 120 performs the following processing for each time step of the simulation.

(Step S102) The motion calculation unit 130 determines the motion of continuum particles in accordance with a physical model that is set for the continuum particles. For example, for continuum particles representing a model of fluid, the motion calculation unit 130 solves the Navier-Stokes equations and the continuity equation, and thereby obtains the acceleration and the time derivatives of the density.

(Step S103) The repulsive force calculation unit 140 selects a continuum particle to be subjected to a calculation of a repulsive force, from among the continuum particles not subjected to a calculation of a repulsive force. The selected continuum particle is hereinafter referred to as a continuum particle of interest.

(Step S104) The repulsive force calculation unit 140 identifies, for the continuum particle of interest, a disk element that satisfies the following conditions as a closest disk element.

Condition 1: The continuum particle of interest is located at the opposite side (back side) of the direction of the normal (front side) as viewed from the disk element.

Condition 2: The continuum particle of interest is located inside a cylinder defined by the disk element and the normal direction.

Condition 3: The disk element is the perpendicularly closest to the continuum particle of interest among disk elements that satisfy both the above two conditions.

A determination as to whether the continuum particle of interest and the disk element satisfy the above conditions is made in the following manner.

Figure 11:
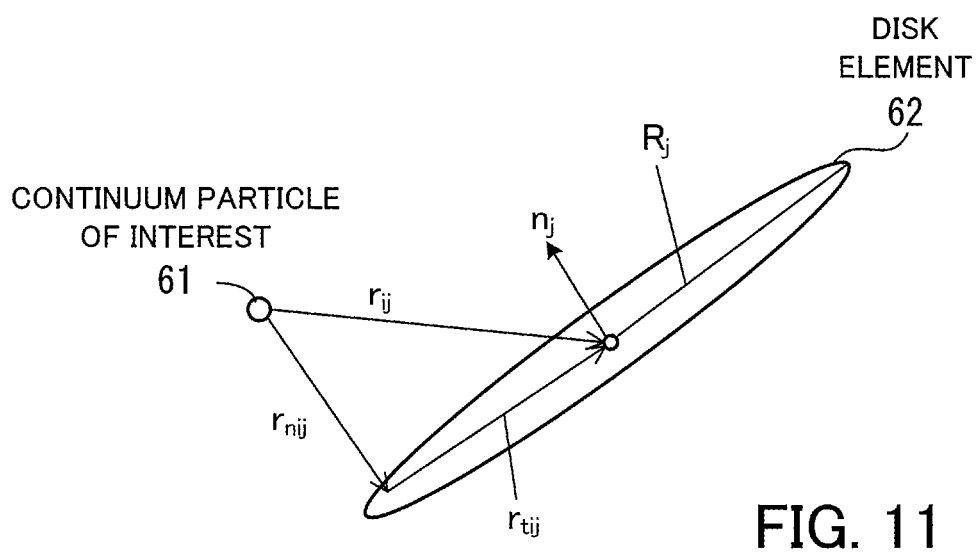
FIG. 11 illustrates an example of determination of the positional relationship between a continuum particle and a disk element.

FIG. 11 illustrates an example of determination of the positional relationship between a continuum particle and a disk element. Here, i (i is an integer equal to or greater than 1) is the number of a continuum particle 61, and j (j is an integer equal to or greater than 1) is the number of a disk element 62. The repulsive force calculation unit 140 calculates a relative position vector from the position of the continuum particle 61 of interest to the center of the disk element 62. The relative position vector may be calculated by calculating the difference between the coordinate components of the center coordinate data of the continuum particle 61 of interest and the coordinate components of the coordinate data of the disk element 62. The repulsive force calculation unit 140 sets the calculated relative position vector as $r_{ij}$.

Then, the repulsive force calculation unit 140 sets the value of the normal vector data of the j-th disk element 62 as $n_j$, and sets the value of the area data of the j-th disk element 62 as $A_j$. The repulsive force calculation unit 140 calculates a component $r_{nij}$ of $r_{ij}$ in the $n_j$ direction, and a component $r_{tij}$ of $r_{ij}$ in the direction perpendicular to $n_j$, using the following equations:

$$r_{nij} = (r_{ij} \cdot n_j) n_j$$

$$r_{tij} = r_{ij} - r_{nij}$$

The repulsive force calculation unit 140 calculates a radius $R_j$ of the disk element 62 as $R_j = (A_j/\pi)^{1/2}$ ($\pi$ is pi). A determination as to whether the "condition 1" is satisfied may be made by determining whether $r_{ij} \cdot n_j < 0$. That is, if $r_{ij} \cdot n_j < 0$, then the continuum particle 61 of interest is located at the front side of the disk element 62, and the "condition 1" is not satisfied. If $r_{ij} \cdot n_j < 0$ is not satisfied, then the continuum particle 61 of interest is located at the back side of the disk element 62, and the "condition 1" is satisfied. Note that in this example, even when $r_{ij} \cdot n_j = 0$, the continuum particle 61 of interest is regarded as being located at the back side of the disk element 62.

A determination as to whether the "condition 2" is satisfied may be made by determining whether $R_j > |r_{tij}|$. That is, if $R_j > |r_{tij}|$ is satisfied, then the "condition 2" is satisfied. In this example, when $R_j = |r_{tij}|$, the "condition 2" is not satisfied. However, when $R_j = |r_{tij}|$, the "condition 2" may be regarded as being satisfied.

Among disk elements that satisfy both the two conditions "condition 1" and "condition 2" with respect to the i-th continuum particle 61 of interest, a disk element with the smallest $|r_{nij}|$ is the closest disk element that satisfies the "condition 3".

Such a determination of the closest disk element is made for all the continuum particles. Note that no closest disk element exists for a continuum particle that is located at the front side of all the disk elements. A closest disk element is calculated for a continuum particle that is located at the back side of at least one disk element.

Now, the discussion returns to FIG. 10.

(Step S105) The repulsive force calculation unit 140 determines whether a closest disk element exists for the continuum particle of interest. If no closest disk element exists, the repulsive force calculation unit 140 determines that the continuum particle of interest does not receive a repulsive force from any disk element. Then, the process proceeds to step S121 (see FIG. 15). If a closest disk element exists, the process proceeds to step S106.

(Step S106) The repulsive force calculation unit 140 creates the intersecting disk list 113 (see FIG. 6), which is a list of disk elements intersecting the closest disk element. The intersecting disk list creation process will be described below in detail (see FIG. 12). Then, the process proceeds to step S111 (see FIG. 14).

The following describes the process of creating the intersecting disk list 113 in detail.

Figure 12:
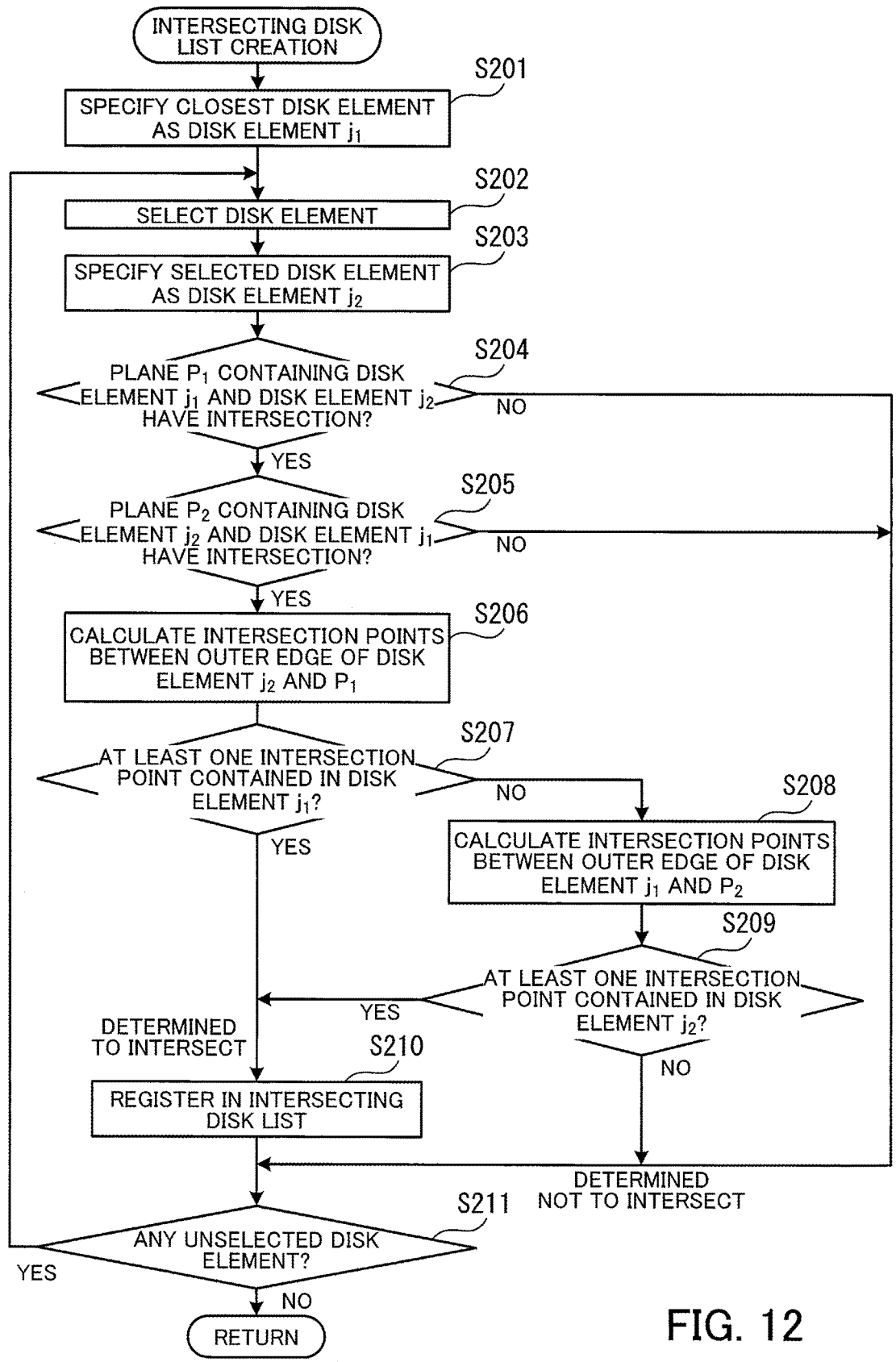
FIG. 12 is a flowchart illustrating an exemplary procedure of an intersecting disk list creation process.

FIG. 12 is a flowchart illustrating an exemplary procedure of an intersecting disk list creation process.

(Step S201) The repulsive force calculation unit 140 specifies the closest disk element as a disk element $j_1$.

(Step S202) The repulsive force calculation unit 140 selects one of disk elements indicated by the respective pieces of disk element data included in the disk element data group 112.

(Step S203) The repulsive force calculation unit 140 specifies the selected disk element as a disk element $j_2$.

(Step S204) The repulsive force calculation unit 140 determines whether a plane $P_1$ containing the disk element $j_1$ and the disk element $j_2$ have an intersection.

Figure 13:
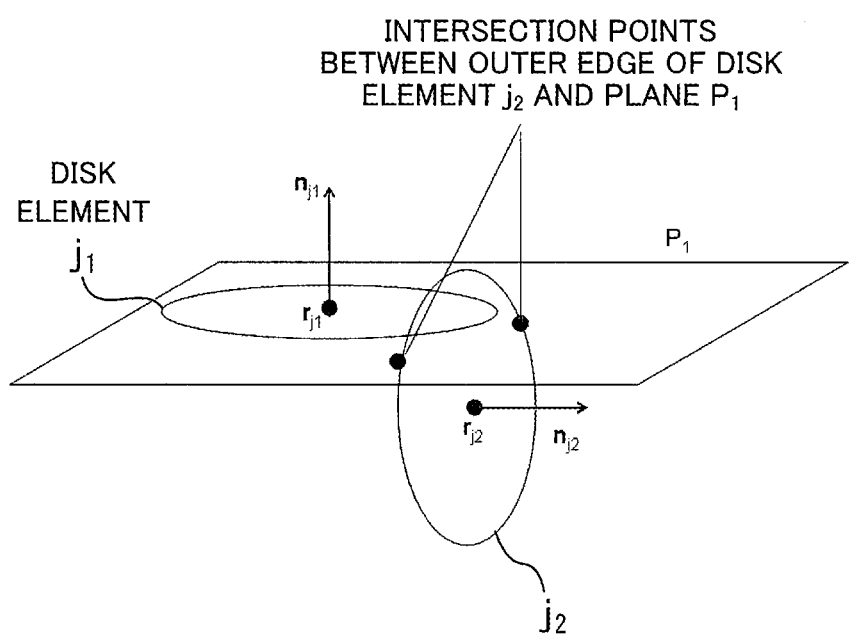
FIG. 13 illustrates an example of determination as to whether two disk elements have an intersection.

FIG. 13 illustrates an example of determination as to whether two disk elements have an intersection. If $|r_{j1j2} \cdot n_{j1}| < R_{j2} \sin \theta_{12}$, then the plane $P_1$ containing the disk element $j_1$ and the disk element $j_2$ are determined to have an intersection. Here, $\theta_{12}$ is an angle between the respective normal vectors $n_{j1}$ and $n_{j2}$ of the two disk elements, and may be calculated as $\theta_{12} = \arccos n_{j1} \cdot n_{j2}$. $|r_{j1j2} \cdot n_{j1}|$ represents a perpendicular distance from the center of the disk element $j_2$ to the plane $P_1$. $R_{j2} \sin \theta_{12}$ represents how far the outer edge of the disk element $j_2$ is from the center of the disk element $j_2$ in the normal direction of the disk element $j_1$.

Now, the discussion returns to FIG. 12.

If the plane $P_1$ containing the disk element $j_1$ and the disk element $j_2$ have an intersection, the process proceeds to step S205. On the other hand, if there is no intersection, the disk elements are determined not to intersect each other, and the selected disk element is not added to the intersecting disk list 113. Then, the process proceeds to step S211.

(Step S205) The repulsive force calculation unit 140 determines whether a plane $P_2$ containing the disk element $j_2$ and the disk element $j_1$ have an intersection. If there is an intersection, the process proceeds to step S206. On the other hand, if there is no intersection, the disk elements are determined not to intersect each other, and the selected disk element is not added to the intersecting disk list 113. Then, the process proceeds to step S211.

(Step S206) If a determination is made that there is an intersection in both steps S204 and S205, the repulsive force calculation unit 140 calculates intersection points (see FIG. 13) between the outer edge of the disk element $j_2$ and the plane $P_1$.

The intersection points may be calculated by solving the simultaneous equations for an unknown vector r. Here, $r_{j1}$ and $r_{j2}$ are obtained from the pieces of center coordinate data of the disk elements; $n_{j1}$ and $n_{j2}$ are obtained from the pieces of normal vector data; and $R_{j2}$ is obtained from the area data. Thus, the following equations with r as the unknown may be written.

$$(r - r_{j1}) \cdot n_{j1} = 0$$

$$(r - r_{j2}) \cdot n_{j2} = 0$$

$$(r - r_{j2})^2 = R_{j2}^2$$

By solving these equations, a maximum of two sets of intersection point coordinates are obtained.

(Step S207) The repulsive force calculation unit 140 determines whether at least one of the obtained intersection points is contained in the disk element $j_1$. For example, if the distance from the center of the disk element $j_1$ to the intersection point is equal to or less than the radius of the disk element $j_1$, the intersection point is contained in the disk element $j_1$. If at least one of the intersection points is contained in the disk element $j_1$, the disk element $j_1$ and the disk element $j_2$ are determined to intersect. Then, the process proceeds to step S210. If none of the intersection points is contained in the disk element $j_1$, the process proceeds to step S208.

(Step S208) The repulsive force calculation unit 140 calculates intersection points between the outer edge of the disk element $j_1$ and the plane $P_2$.

(Step S209) The repulsive force calculation unit 140 determines whether at least one of the obtained intersection points is contained in the disk element $j_2$. If at least one of the intersection points is contained in the disk element $j_2$, the disk element $j_1$ and the disk element $j_2$ are determined to intersect. Then, the process proceeds to step S210. If none of the intersection points is contained in the disk element $j_2$, the disk element $j_1$ and the disk element $j_2$ are determined not to intersect. Then, the process proceeds to step S211.

(Step S210) The repulsive force calculation unit 140 registers, in the intersecting disk list 113, the disk element $j_2$ that is determined to intersect the disk element $j_1$. For example, the repulsive force calculation unit 140 registers, in the intersecting disk list 113, a pair of the disk element number of the disk element $j_2$ and angle flag data indicating whether the disk element $j_1$ and the disk element $j_2$ intersect so as to form a projection or a recess. Note that a determination as to whether the angle at which the two disk elements $j_1$ and $j_2$ intersect forms a projection or a recess may be made based on the sign of the inner product of the relative position vector $r_{j1j2}$ between the two disk elements $j_1$ and $j_2$ and each of the normal vectors $n_{j1}$ and $n_{j2}$.

(Step S211) The repulsive force calculation unit 140 determines whether there is any unselected disk element in the disk element data group 112. If there is any unselected disk element, the process returns to step S202. If there is no unselected disk element, the intersecting disk list creation process ends.

In this manner, the intersecting disk list 113 is created in which the number of each disk element intersecting the closest disk element and a flag variable indicating the angle at which that disk element and the closest disk element intersect. By using the created intersecting disk list 113, a repulsive force to the continuum particle of interest is calculated.

Figure 14:
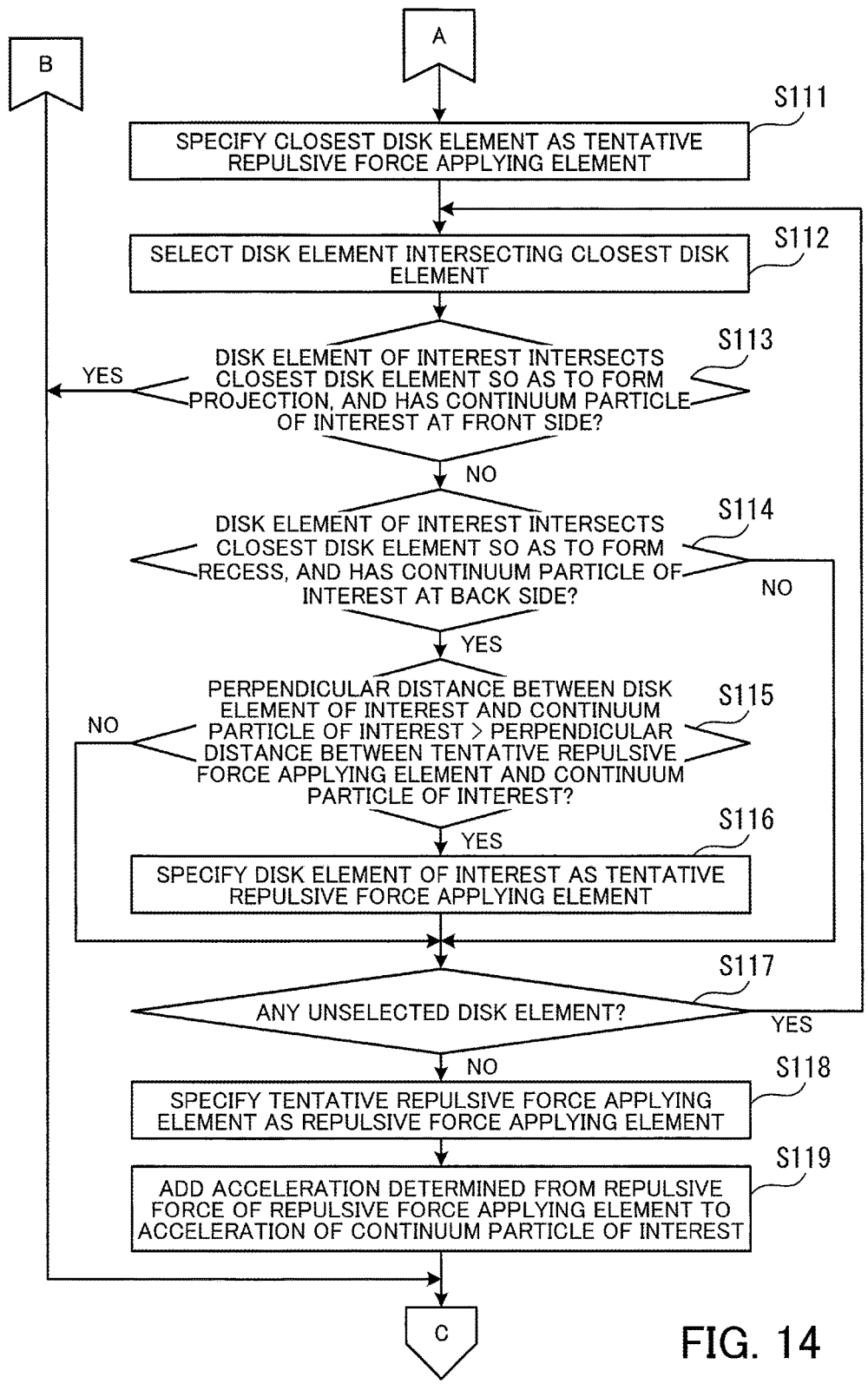
FIG. 14 is a second flowchart illustrating the exemplary procedure of simulation.

FIG. 14 is a second flowchart illustrating the exemplary procedure of simulation. In the process illustrated in FIG. 14, a disk element (repulsive force applying element) that applies a repulsive force to the continuum particle of interest is specified.

(Step S111) The repulsive force calculation unit 140 specifies the closest disk element to the continuum particle of interest as a tentative repulsive force applying element. In the following description, an i-th continuum particle is the continuum particle of interest, and is referred to as the continuum particle i of interest.

For example, the closest disk element to the i-th continuum particle is represented by a number $j_0$, and the disk elements contained in the intersecting disk list created for the closest disk element $j_0$ are represented by $j_1$ through $j_n$. The repulsive force calculation unit 140 first specifies the closest disk element $j_0$ to the i-th continuum particle as a tentative repulsive force applying element, and stores a perpendicular distance between the number $j_0$ and the continuum particle in the memory.

(Step S112) The repulsive force calculation unit 140 selects one of the unselected disk elements $j_1$ through $j_n$ intersecting the closest disk element $j_0$, from the intersecting disk list 113. Hereinafter the selected disk element is referred to as a disk element of interest $j_k$.

(Step S113) The repulsive force calculation unit 140 determines whether a condition that the disk element $j_k$ of interest intersects the closest disk element $j_0$ so as to form a projection, and the continuum particle i of interest is located at the front side of the disk element $j_k$ of interest is satisfied. A determination as to whether the disk element $j_k$ of interest intersects the closest disk element $j_0$ so as to form a projection may be made using the angle flag data of the intersecting disk list 113. Further, a determination as to whether the continuum particle i of interest is located at the front side of the disk element $j_k$ of interest may be made based on the sign of the inner product of a relative position vector $r_{ijk}$ from the continuum particle i of interest to the disk element $j_k$ of interest and a normal vector $n_{jk}$ of the disk element $j_k$ of interest. If the sign of the inner product is negative, the continuum particle i of interest is located at the front side of the disk element $j_k$ of interest. If the condition is satisfied, the continuum particle i of interest is determined not to receive a repulsive force from the disk element $j_k$ of interest. Then, the process proceeds to step S121 (see FIG. 15). If the condition is not satisfied, the process proceeds to step S114.

(Step S114) The repulsive force calculation unit 140 determines whether a condition that the disk element $j_k$ of interest intersects the closest disk element $j_0$ so as to form a recess, and the continuum particle i of interest is located at the back side of the normal of the disk element $j_k$ of interest is satisfied. A determination as to whether the disk element $j_k$ of interest intersects the closest disk element $j_0$ so as to form a recess may be made using the angle flag data of the intersecting disk list 113. A determination as to whether the continuum particle i of interest is located at the back side of the normal of the disk element $j_k$ of interest may be made based on the sign of the inner product of the relative position vector $r_{ijk}$ from the continuum particle i of interest to the disk element $j_k$ of interest and the normal vector $n_{jk}$ of the disk element $j_k$. If the sign of the inner product is positive, the continuum particle i of interest is located at the back side of the disk element $j_k$ of interest. If the condition is satisfied, the process proceeds to step S115. If the condition is not satisfied, the process proceeds to step S117.

(Step S115) The repulsive force calculation unit 140 determines whether a perpendicular distance between the continuum particle i of interest and the disk element $j_k$ of interest is greater than a perpendicular distance from the tentative repulsive force applying element and the continuum particle i of interest. The perpendicular distance between the continuum particle i of interest and the disk element $j_k$ of interest is $|r_{ijk} \cdot n_{jk}|$, that is, the absolute value of the inner product of the relative position vector $r_{ijk}$ from the continuum particle i of interest to the disk element $j_k$ of interest and the normal vector $n_{jk}$ of the disk element $j_k$ of interest. By comparing the absolute value of the inner product with the perpendicular distance to the tentative repulsive force applying element, a determination may be made as to which of the perpendicular distances is greater. If the perpendicular distance between the continuum particle i of interest and the disk element $j_k$ of interest is greater, the process proceeds to step S116. If not, the process proceeds to step S117.

(Step S116) The repulsive force calculation unit 140 specifies the current disk element $j_k$ of interest as a tentative repulsive force applying element. Then, the repulsive force calculation unit 140 stores the perpendicular distance between the disk element $j_k$ of interest and the continuum particle i of interest, in the memory.

(Step S117) The repulsive force calculation unit 140 determines whether there is any unselected disk element in the intersecting disk list 113. If there is any unselected disk element, the process returns to step S112. If all the disk elements are already selected, the process proceeds to step S118.

(Step S118) The repulsive force calculation unit 140 specifies, as a repulsive force applying element, the disk element that is specified as a tentative repulsive force applying element when the processing of steps S113 through S116 is performed on all the disk elements on the intersecting disk list 113. Then, the repulsive force calculation unit 140 calculates a repulsive force from the disk element specified as a repulsive force applying element.

A force applied between the i-th continuum particle and the j-th disk element is calculated based on a perpendicular distance $|r_{nij}|$ along the normal of the disk element. The direction in which the repulsive force is applied is the normal direction of the disk element. For example, a repulsive force $f_{ij}$ is expressed by the following equation.

$$f_{ij} = n_j f_{0,i} \{q/(1-q)\}$$

Here, $q=|r_{nij}|/r_{cutoff}$, where $r_{cutoff}$ is a length representing a distance scale that indicates the maximum allowable distance of movement from the disk surface to the back side, and is a predetermined constant. The value of $r_{cutoff}$ is comparable to, for example, the value of the spatial resolution of continuum particles. The spatial resolution is a value indicating how precisely the motion of fluid or an elastic body is spatially represented. The spatial resolution is, for example, the average distance between continuum particles forming fluid or an elastic body.

In the above equation, $f_{0,i}$ is the magnitude of a reference repulsive force, and is a predetermined constant. For example, $f_{0,i}$ may be $m_i c_{s,i}^2/r_{cutoff}$, where $m_i$ is the mass of the continuum particle i, and $c_{s,i}$ is the sound velocity of the continuum particle i. Thus, it is possible to prevent even a continuum particle with a very large kinetic energy from moving out of the repulsive force application range at the back side of the fixed boundary.

(Step S119) The repulsive force calculation unit 140 adds an acceleration determined from the calculated repulsive force $f_{ij}$ to the acceleration of the continuum particle of interest that has already been obtained in step S102. Then, the process proceeds to step S121 (see FIG. 15).

Figure 15:
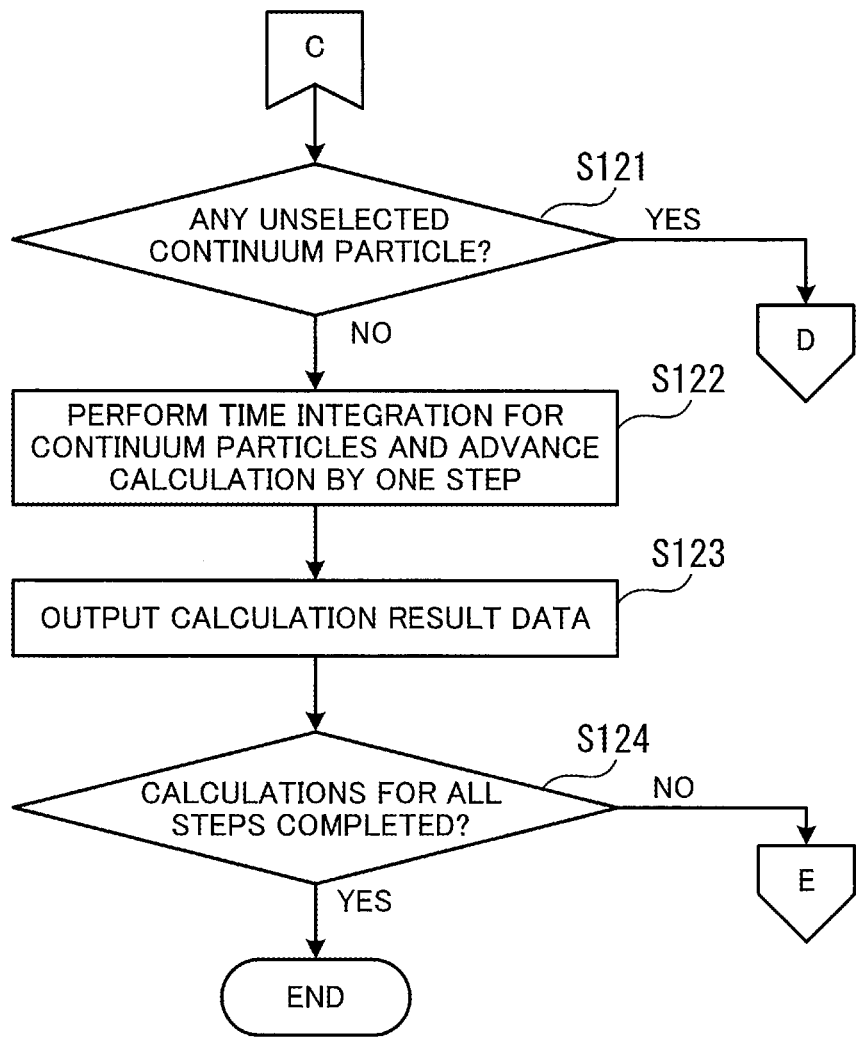
FIG. 15 is a third flowchart illustrating the exemplary procedure of simulation.

FIG. 15 is a third flowchart illustrating the exemplary procedure of simulation.

(Step S121) The repulsive force calculation unit 140 determines whether there is any unselected continuum particle. If there is an unselected continuum particle, the process returns to step S103 (see FIG. 10). If all the continuum particles are selected, and the calculation of a repulsive force is completed, the process proceeds to step S122.

(Step S122) The motion calculation unit 130 time-integrates the physical quantity (velocity, acceleration, and so on) of each continuum particle by using the time-derivative terms including the acceleration obtained based on the repulsive force, and thereby calculates the position and physical quantity of each continuum particle after one time step. Then, the simulation control unit 120 advances the time in the simulation by one time unit. Thus, the calculation for one time step is completed.

(Step S123) The simulation control unit 120 outputs the calculation result data for one time step as an external file. The output external file is stored, for example, in the HDD 103. The output file is used when a separately provided program displays needed numerical values and graphics on the screen or prints such numerical values and graphics on paper.

(Step S124) The simulation control unit 120 determines whether calculations for all the time steps of the simulation period are completed. If there is any time step for which a calculation is not performed, the process returns to step S102.

In this manner, the position and physical quantity of each continuum particle in each time step of the simulation period are calculated. As the result, the motion of fluid or an elastic body to be analyzed is simulated.

As described above, according to the second embodiment, a repulsive force is applied to a continuum particle when the continuum particle moves to the back side of disk elements. Thus, even if there is a narrow gap in the boundary shape defined by the disk elements, it is possible to simulate the inflow of continuum particles.

Further, since the shape of the fixed boundary is represented by disk elements, there is no need to handle information on connections between elements. This reduces cumbersome processing when generating the shape, and makes it easy to set a fixed boundary that completely covers the surface.

When a general shape is defined using disk elements, the ends of disk elements may protrude beyond the shape to be represented. However, by adjusting the way of applying a repulsive force based on the angle between the disk elements, it is possible to prevent an unnatural repulsive force from being generated at the ends of the disk elements.

The simulation using the particle method illustrated in the second embodiment is applicable to a wide range of fields. For example, the simulation may be used for fluid analysis of river and sea water when making a disaster prevention plan, and may be used for analysis of a casting process when designing a product. By applying the simulation to an elastic body, it is possible to appropriately determine the shape and so on of sealing gel when designing a product. In particular, the system according to the second embodiment is useful in analyzing the motion of fluid or an elastic body that enters a very narrow gap. For example, in the case of analyzing the motion of an elastic body that is pressed by a machine which makes an action of pressing an elastic body, it is important to accurately analyze the motion of the elastic body in a narrow gap when the elastic body is pressed. If continuum particles are not able to enter a narrow space generated by the pressing action, it is not likely to obtain an accurate analysis result. In the second embodiment, since continuum particles are able to enter a narrow gap, it is possible to perform an accurate analysis.

While particular embodiments of the present invention have been illustrated and described, it would be obvious that the components described in the embodiments may be replaced with other components having similar functions. Further, other arbitrary structures and steps may be added. Furthermore, two or more arbitrary structures (features) of the embodiments described above may be combined.

According to an aspect, it is possible to perform an analysis on a region having a narrow gap, using a particle method.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A non-transitory computer-readable storage medium storing a computer program that causes a computer to perform a procedure comprising:
    determining, based on positions of a plurality of particles representing a continuum and positions of a plurality of elements representing a boundary between a first region and a second region, whether each of the plurality of particles is located in the second region;
    calculating, for a particle located in the second region, a force toward the first region, based on a distance between the boundary represented by the plurality of elements and the particle; and
    analyzing motion of the plurality of particles while applying the force to the particle located in the second region.

2. The non-transitory computer-readable storage medium according to claim 1, wherein:
    each of the plurality of elements has a first surface facing the first region and a second surface facing the second region; and
    the determining includes selecting each of the plurality of particles as a particle of interest, and determining that the particle of interest is located at the second region when there are one or more elements with the particle of interest located at a second surface side thereof and when the particle of interest is not located at a first surface side of an intersecting element that intersects a closest element, the intersecting element intersecting the closest element so as to project toward the first region, the closest element being closest to the particle of interest among the elements with the particle of interest located at the second surface side thereof.

3. The non-transitory computer-readable storage medium according to claim 1, wherein:
    each of the plurality of elements has a first surface facing the first region and a second surface facing the second region; and
    the calculating includes calculating the force in a normal direction at a first surface side of an element that is closest to the particle among particular elements, included in the plurality of elements, with the particle located at a second surface side thereof.

4. The non-transitory computer-readable storage medium according to claim 1, wherein the calculating includes, when the particle is located at a second surface side of each of a first element and a second element that intersect so as to be recessed away from the first region, calculating the force based on a distance between the particle and one of the first and second elements that is farther from the particle.

5. A simulation method comprising:
    determining, by a processor, based on positions of a plurality of particles representing a continuum and positions of a plurality of elements representing a boundary between a first region and a second region, whether each of the plurality of particles is located in the second region;
    calculating, by the processor, for a particle located in the second region, a force toward the first region, based on a distance between the boundary represented by the plurality of elements and the particle; and analyzing, by the processor, motion of the plurality of particles while applying the force to the particle located in the second region.

6. A simulation apparatus comprising:

a memory configured to store positions of a plurality of particles representing a continuum and positions of a plurality of elements representing a boundary between a first region and a second region; and a processor configured to perform a procedure including:

determining, based on the positions of the plurality of particles and the positions of the plurality of elements, whether each of the plurality of particles is located in the second region, calculating, for a particle located in the second region, a force toward the first region, based on a distance between the boundary represented by the plurality of elements and the particle, and analyzing motion of the plurality of particles while applying the force to the particle located in the second region.

* * * * *